United States Patent [19]

Ikeda et al.

[11] 4,209,805

[45] Jun. 24, 1980

[54] VIDEO SIGNAL PROCESSING CIRCUIT INCLUDING LOCK-OUT PREVENTION MEANS FOR THE INTERMEDIATE FREQUENCY AMPLIFIER THEREOF

[76] Inventors: Tsuneo Ikeda, 4-595-24 Tomoda-cho, Ohme-shi, Toyko; Kenichi Tonomura, 1-3-17 Wakaba-cho, Tachikawa-shi, Tokyo, both of Japan

[21] Appl. No.: 920,249

[22] Filed: Jun. 29, 1978

[30] Foreign Application Priority Data

Aug. 10, 1977 [JP] Japan ............................ 52-95082

[51] Int. Cl.² ............... H04N 5/52; H03G 3/30; H04B 1/16; H04N 5/14
[52] U.S. Cl. ........................... 358/175; 358/184; 455/251; 455/253
[58] Field of Search ............... 358/174–179, 358/184, 21; 330/134, 254, 279; 325/319, 404

[56] References Cited

U.S. PATENT DOCUMENTS

| | | | |
|---|---|---|---|
| 2,756,327 | 7/1956 | Keizer | 358/179 X |
| 2,889,400 | 6/1959 | Rogers | 358/184 X |
| 3,251,938 | 5/1966 | Ruby | 358/174 |
| 3,301,951 | 1/1967 | Humphrey | 358/174 |
| 3,511,930 | 5/1970 | Rupley | 358/179 X |
| 3,665,317 | 5/1972 | Crow | 330/254 X |
| 3,838,210 | 9/1974 | Peil | 358/179 |
| 3,898,380 | 8/1975 | Wilcox | 358/177 |

*Primary Examiner*—John C. Martin
*Assistant Examiner*—Aristotelis M. Psitos
*Attorney, Agent, or Firm*—Craig and Antonelli

[57] ABSTRACT

A video signal processing circuit adapted for use in TV receivers. The circuit includes an intermediate frequency amplifier circuit having signal amplifying transistors, a synchronous detection circuit adapted to produce the carrier signal and to produce a detection signal by making use of the reproduced carrier signal, a first gain control circuit adapted to deliver a gain control signal to the intermediate frequency amplifier circuit in accordance with the level of the detection signal and a second gain control circuit adapted to deliver a gain control signal to the intermediate frequency amplifier circuit in accordance with the level of the output from the latter. The second gain controller circuit is adapted to function to lower the gain of the intermediate frequency amplifier circuit, so as to recover the ordinary operating condition of the circuit, when the intermediate frequency amplifier circuit is undesirably locked at the full-gain condition during receiving of a broadcasting wave of a large electric field strength.

9 Claims, 6 Drawing Figures

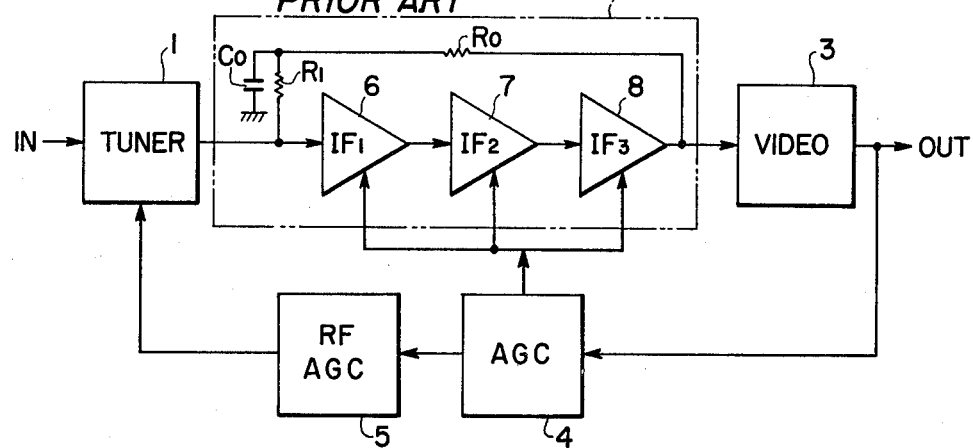
FIG. IA
PRIOR ART
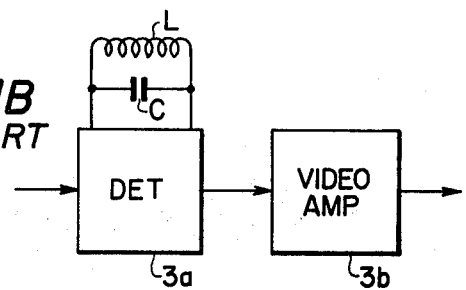
FIG. IB
PRIOR ART
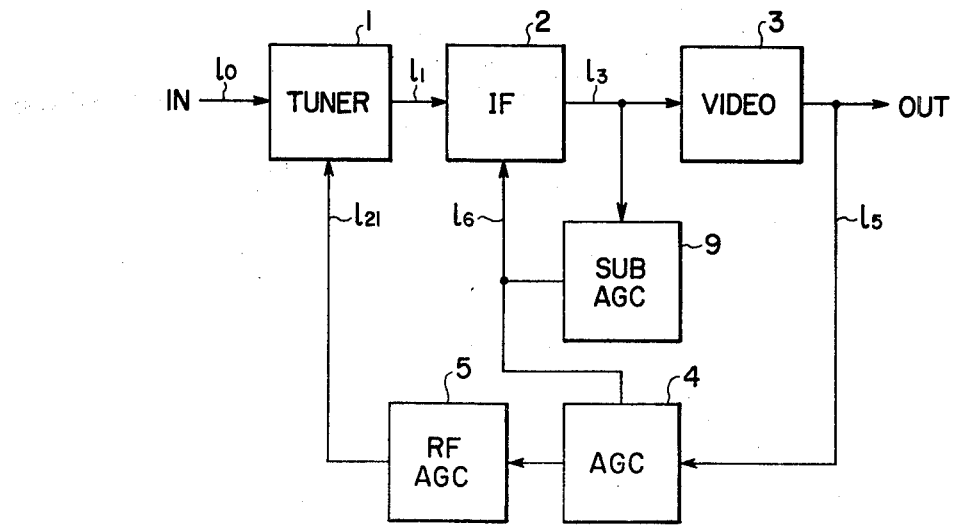
FIG. 2

VIDEO SIGNAL PROCESSING CIRCUIT INCLUDING LOCK-OUT PREVENTION MEANS FOR THE INTERMEDIATE FREQUENCY AMPLIFIER THEREOF

BACKGROUND OF THE INVENTION

The present invention relates to a video image processing circuit and, more particularly, to a video image processing circuit including an image detection circuit of synchronous detection type.

In TV receivers, the gains of the tuner and the intermediate frequency amplifier circuit (referred to as IF amplifier) are controlled automatically in accordance with the level of the output from the image detection circuit which receives the output from the IF amplifer, i.e. with the level of the video signal. Consequently, the video detection circuit produces output video signal of a substantially constant level, in spite of possible change of the intensity of the received signal.

The video detection circuit of synchronous type is superior to the diode type detection circuit, because it provides better linearity and, accordingly, exhibits better detection characteristics even for a low level of the input signal, as compared with the diode type detection circuit. In addition, the synchronous type picture detection circuit poses a relatively small load to the IF amplifier. For these reasons, the synchronous type picture detection circuit can easily be formed as a semiconductor integrated circuit (referred to as IC) in combination with, for example, the IF amplifier.

However, it has been proven as a result of experiments that this synchronous type detection circuit poses a problem as stated below. Namely, when a channel of large electric field strength is selected after a switching of the channel or after turning the power switch on or off, the level of the detection signal of the video detection circuit is changed substantially to zero, although the channel is correctly selected, so that the automatic gain control signal (referred to as the AGC signal) to be delivered to the tuner and the IF amplifier is inconveniently held at such a level as to lock the circuit in full gain condition.

SUMMARY OF THE INVENTION

It is therefore an object of the invention to provide a video signal processing circuit which does not cause a locking of the AGC loop.

It is another object of the invention to provide a video signal processing circuit which can suitably be formed as an IC.

To these ends, according to the invention, there is provided a video signal processing circuit comprising an intermediate frequency amplifier circuit making use of a signal amplifying transistor, a synchronous detection circuit adapted to reproduce a carrier signal in accordance with the output from the intermediate frequency amplifier circuit and to obtain a detection signal by making use of the carrier signal, a first automatic gain control circuit adapted to deliver a gain control signal to the intermediate frequency amplifier circuit in accordance with the level of the detection signal, and a second gain control circuit adapted to lower the gain of the intermediate frequency amplifier circuit upon detection of the operation of the signal amplifying transistor in its saturated condition.

These and other objects, as well as advantageous features of the invention will become more clear from the following description of the preferred embodiment taken in conjunction with the accompanying drawings.

BRIEF DESCRIPTION OF THE DRAWINGS

FIG. 1A is a block diagram of a typical conventional video signal processing circuit, FIG. 1B is a block diagram of a typical video detection circuit.

FIG. 2 is a block diagram of an embodiment of the invention,

DESCRIPTION OF THE PREFERRED EMBODIMENTS

Figure 3:
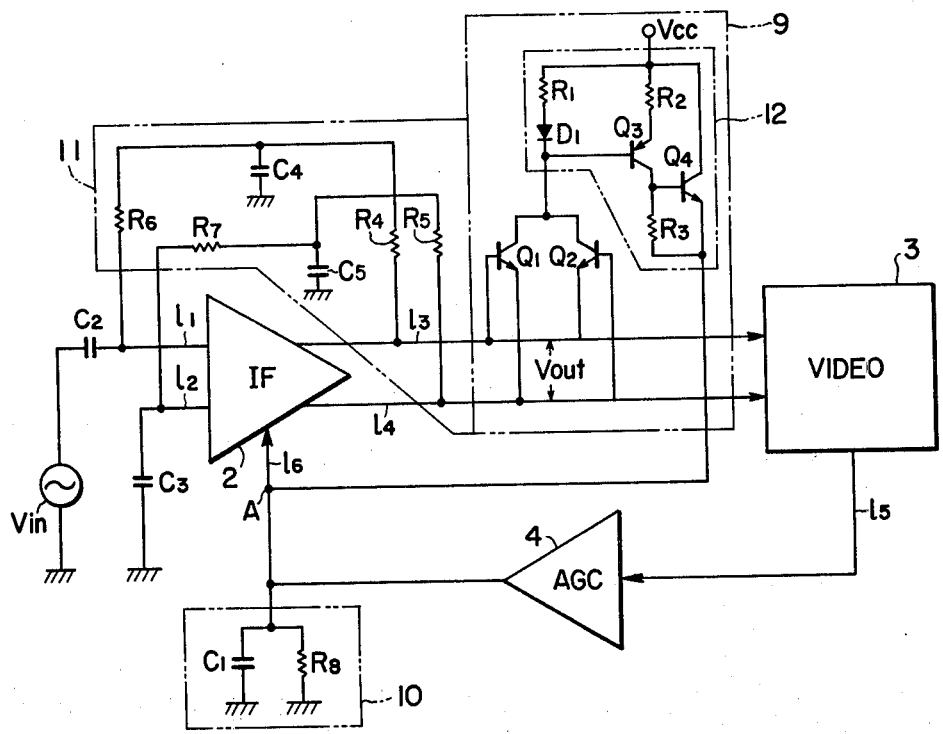
FIG. 3 is a circuit diagram including a block diagram of a more practical embodiment.

Before turning to the description of the preferred embodiments, the construction and operation of a conventional circuit which does not incorporate the present invention will be described with specific reference to FIG. 1A, for an easier understanding of the invention.

A typical conventional video signal amplifier circuit has a tuner 1 adapted to selectively amplify the signal IN from an antenna and to convert the same into a signal of intermediate frequency, an IF amplifier 2 adapted to receive the output from the tuner 1, a video detecting circuit 3 of synchronous detection type adapted to output a picture signal upon receipt of the output from the IF amplifier 2, an automatic gain control circuit (referred to as AGC circuit) 4 adapted to produce a gain control signal in accordance with the level of the output signal from the video detection circuit upon receipt of the latter, and an AGC circuit (referred to as RFAGC circuit) 5 adapted to receive the output from the AGC circuit 4.

As will be seen from FIG. 1B, the video detection circuit 3 of the synchronous type substantially consists of a detection stage 3a and an amplifier stage 3b, so as to provide the output video signal at a level which has been amplified from the level of the input signal.

Although not critical, the AGC circuit 4 is adapted to lower the gain of the IF amplifier 2 from the time at which the level of the video signal is still relatively low, while the RFAGC circuit 5 is adapted to commence to lower the gain of the tuner 1 after the level of the video signal has grown relatively high. The deterioration of the SN ratio of the video signal is diminished by making the output level of the tuner 1 as high as possible, through effecting a delay control by the RFAGC circuit 5 in the described manner.

The above mentioned circuits 2 to 5 are built in an IC chip.

The IF amplifier 2 formed in the IC has a multiplicity of stages. For instance, the IF amplifier consists of three stages of IF amplifier units $IF_1$ to $IF_3$ which are arranged in a cascade connection as illustrated. These IF amplifier units connected directly, without the interconnection of DC cut off means such as capacitors. In this case, in order to obtain adequate operation points of these units, a DC feedback circuit consisting of resistances $R_0$, $R_1$ and a capacitance $C_0$ is connected between the input side of the first stage IF amplifier unit $IF_1$ and the output side of the third IF amplifier unit $IF_3$.

In operation of the video signal processing circuit having the described construction, when the gain of the tuner 1 or the IF amplifier 2 is lowered by the signal from the AGC circuit 4 or the RFAGC circuit 5 under a large input electric field strength, no excessive output is generated by the tuner 1 nor from the IF amplifier 2.

However, if the level of the video signal delivered from the video detection circuit 3 happens to be turned to zero by, for example, a switching of the channels or the turning on and off of the power supply under the large input electric field strength, the control output from the AGC circuit is turned to zero level in response to the zero level of the video signal, so that the IF amplifier is inconveniently turned to the full-gain condition. Consequently, when the receiver turns to the receiving of the broadcasting wave of the large electric field strength, the level of the input signal to the IF amplifier becomes excessively high.

As a results of an experiment, it has been found that the aforementioned lock out is attributable to an storage effect of the transistors. The amplification in the IF amplifier is performed by the transistors. Thus, when the signal level becomes excessively high, the collector voltage drops below the base voltage, so as to force the transistors to function at their saturated region.

In the amplification operation of the IF amplifier at the excessively high signal level, the outputs of respective IF amplifier units can respond at a high speed to such input signals as to turn respective transistors from OFF state to On state, but respond with a certain time lag, which is determined by the storage effect of the minor carriers, to such inputs as to turn the transistors from ON to OFF states.

Consequently, the intermediate frequency carrier wave signal of such a relatively high frequency at the input side as 58.75 MGz is not output from the IF amplifier units, during the period in which the transistors are turned from ON to OFF states.

Since the cascade IF amplifier units $IF_1$ to $IF_3$ successively amplify the signal, at first the third unit $IF_3$ comes to function in its saturated range, as the level of the input signal comes higher. When only the third IF amplifier unit $IF_3$ functions in the saturated condition while other units are unsaturated, the third IF amplifier unit $IF_3$ outputs the component of the intermediate frequency carrier wave signal only during the period in which the transistor of this third IF amplifier unit is turned from OFF to ON states.

Then, as the second IF amplifier unit $IF_2$ becomes saturated, i.e. when two IF amplifier units $IF_2$ and $IF_3$ function in the saturated conditions, the states of conductivity of these units become contrary to each other, so that no component of the intermediate frequency carrier wave signal appears in the output from the third IF amplifier unit $IF_3$.

The level of the detection output is changed substantially to zero, when the intermediate frequency carrier wave signal is erased from the output from the IF amplifier, when the video detection circuit 3 is constituted by a so-called synchronous type detection system in which the intermediate frequency signal is detected through making use of a signal from a synchronizing circuit adapted to produce the signal in synchronization with the intermediate frequency carrier wave signal delivered from the IF amplifier, or by a so-called quasi synchronous detection system which makes use of a signal selectively amplified from the intermediate frequency carrier wave signal delivered from the IF amplifier. Consequently, the level of the gain control output of the AGC circuit is lowered substantially to zero, due to the substantially zero level output from the video detection circuit 3, so that the circuit is locked out in the full gain condition, even when receiving the broadcasting wave.

According to the results of the experiment, the lock out of the circuit is not caused by such a level of the input signal as causes the saturation of only the third IF amplifier unit, but takes place when the input signal is increased to such a level as to bring more than two IF amplifier units into the saturated conditions.

The above described shortcoming of the prior art can fairly be avoided by the present invention, as will be seen from the following description of the preferred embodiments.

Referring first to FIG. 2 showing a block diagram of a preferred embodiment of the invention, the circuit of the video signal processing circuit in accordance with the invention includes a tuner 1, an IF amplifier 2 adapted to receive the output from the tuner 1 and consisting materially of three stages of IF amplifier units, a video detection circuit 3 adapted to receive the output from the IF amplifier circuit, a first AGC circuit adapted to receive the output from the video circuit 3, an RFAGC circuit 5 adapted to receive the output from the first AGC circuit 4, and a second AGC circuit 9 adapted to receive the output from the IF amplifier 2. The output of the AGC circuit is connected to an AGC input terminal of the IF amplifier 2, so as to form a negative feedback loop, while another negative feedback loop is formed by connecting the output of the RFAGC circuit 5 to an AGC input terminal of the tuner 1. Further, the output of the second AGC circuit 9 is connected to the AGC input terminal of the IF amplifier, so as to form still another negative feedback loop.

The second AGC circuit 9 is adapted to function substantially in the same manner as the first AGC circuit 4, and produces an AGC signal in accordance with the level of the signal input from the IF amplifier 2. More specifically, the second AGC circuit 9 is adapted to control the gain of the IF amplifier 2, upon detect of the level of the output from the IF amplifier becoming excessively high.

According to the circuit arrangement as described above, the first and the second AGC circuits automatically controls the gains of the IF amplifier 2 and the tuner 1, during an ordinary or normal receiving condition in which no switching of the channels nor the turning on and off of the power switch is made, even when the electric field strength of the received wave is large.

However, when the channels are switched or when the power source is turned on and off during receiving of the wave of large electric field strength, the AGC circuit 4 is rendered inoperative due to the presence of a dead time, so as to turn the IF amplifier into the full gain condition.

In this full gain condition of the IF amplifier 2, the level of the video signal from the video detection circuit 3 is lowered substantially to zero, because the output signal from the IF amplifier 2 comes not to include the component of the intermediate frequency carrier wave signal, for the reason as stated before. Consequently, the first AGC circuit 4 comes to produce an AGC signal for turning the IF amplifier into the full gain condition. Meanwhile, the second AGC circuit 9 produces an AGC signal, upon detection of the level of the output from the IF amplifier 2, irrespective of whether the output from the IF amplifier contains the above mentioned component of the intermediate frequency carrier wave signal.

Thus, an AGC voltage is forcibly applied to the AGC input terminal of the IF amplifier 2, by the functioning of the second AGC circuit 9, so as to recover the automatic gain control, thereby to recover the ordinary output from the IF amplifier 2 including the intermediate frequency carrier wave component of 58.75 MHz. Consequently, the video detection circuit 3 is allowed to function in the ordinary way, so as to exclude the undesirable lock out which would for otherwise cause an extraordinary functioning of the AGC circuit 4. The second AGC circuit 9 is turned inoperative, as the safe functioning of the first AGC circuit 4 and, accordingly, the ordinary outputting condition of the IF amplifier 2 are recovered.

FIG. 3 is a circuit diagram including a block diagram of a more practical embodiment of the invention, for building the circuit of the invention in an IC. For a clarification of the drawing, the tuner 1 and the RFAGC 5 as shown in FIG. 2 have been eliminated from the circuit diagram of FIG. 3. Practical forms of the circuits of blocks 2 and 4 included by the circuit of FIG. 3 are shown in FIGS. 4 and 5, respectively.

Figure 4:
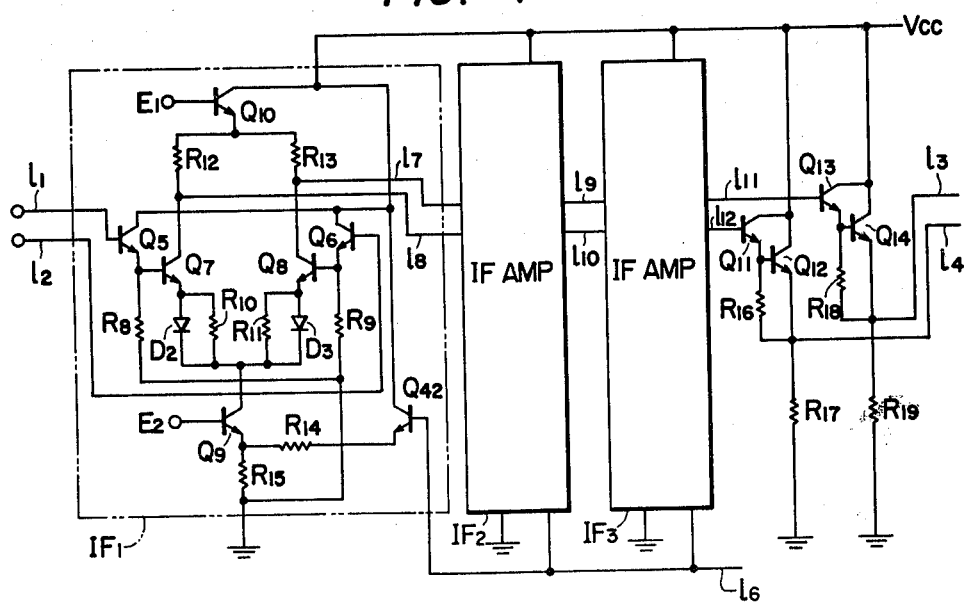
FIG. 4 is a detailed circuit diagram of a block 2 of the diagram as shown in FIG. 3.
Figure 5:
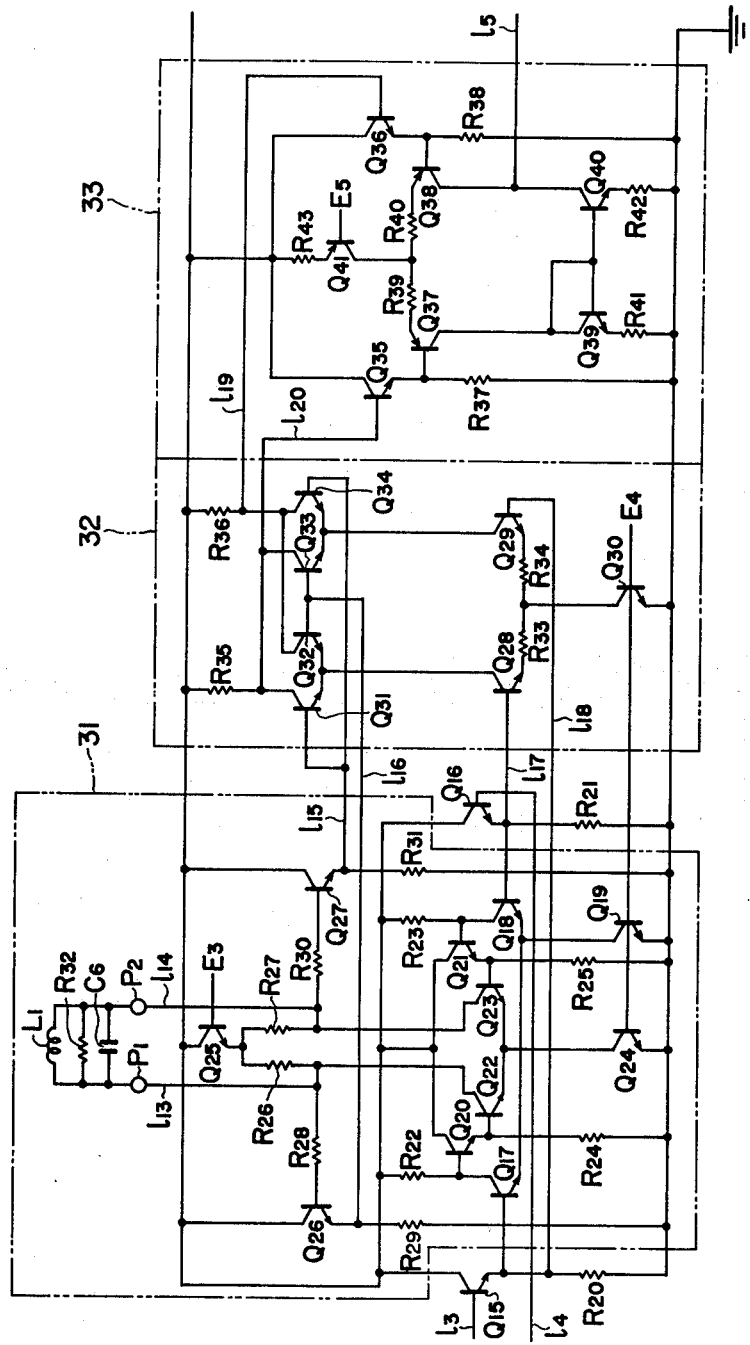
FIG. 5 is a detailed circuit diagram of a block 3 of the diagram as shown in FIG. 3.

As will be seen from FIG. 4, the IF amplifier 2 of FIG. 3 consists of IF amplifier units $IF_1$ to $IF_3$. FIG. 4 shows only the IF amplifier unit $IF_1$, because these units have strictly identical construction.

The IF amplifier unit $IF_1$ has emitter-follower transistors Q5, Q6, resistances R8,R9, differential transistors Q7,Q8, resistances R10 to R15, diodes D2 and D3, constant current transistor Q9 and an emitter-follower transistor Q42. A bias circuit (not shown) consisting of a resistance and a diode is adapted to apply a bias voltage E2 to the base of the above mentioned constant current transistor Q9.

The AGC signals from the AGC circuits 4 and 9 are transmitted to the base of the emitter-follower transistor 42, through a line $l_6$. The emitter of the transistor Q42 is connected through the resistance R14 to the emitter of the constant current transistor Q9. Consequently, the collector current of the constant current transistor Q9 is decreased as the level of the AGC signal on the line $l_6$ is increased.

The diodes D2 and D3 function, due to their forward voltage-current characteristics and non-linearities, as variable resistors which exhibit a high operation resistance for a small operation current therethrough. The resistances R10 and R11 connected in parallel with the diodes D2 and D3 are intended for adjusting the characteristic of change of the operation resistance.

As the level of the AGC signal gets higher, the collector current of the constant-current transistor Q9 is decreased, so as to decrease the operation current of the diodes D2 and D3. The emitters of the differential transistors Q7 and Q8 are then connected through a high operation resistance of the Diodes D2,D3. Therefore, it is derived that the amplification factors of the differential transistors Q7 and Q8 are lowered as the level of the AGC signal is raised.

The output from this stage of IF amplifier unit is delivered to the IF amplifier unit of the next stage IF2 through the collector load resistances R12 and R13.

Although not essential nor critical, a transistor Q10 is connected between the power source line Vcc and the resistances R12,R13. A constant voltage E1 is supplied from a bias circuit (not shown) to the base of the transistor Q10. Undesirable electrical coupling of the IF amplifier units with each other or with other circuits through the power line Vcc is avoided by the presence of the transistor Q10.

An emitter-follower circuit consisting of transistors Q13,Q14 and resistances R18,R19, and another emitter-follower circuit consisting of transistors Q11,Q12 and resistances R16,R17 are connected, respectively, to the output lines $l_{11}$ and $l_{12}$ of the third stage IF amplifier unit IF3. These two emitter-follower circuits delivers the output from the IF amplifier 2 to lines $l_3$ and $l_4$.

FIG. 5 shows by way of example a circuit arrangement of the video detection circuit 3 as shown in FIG. 3.

The circuit as shown in FIG. 5 has a selective amplifier circuit 31, detection circuit 32 and an amplifier circuit 33. The selective amplifier circuit 31 consists of first differential transistors Q17,Q18, second differential transistors Q22,Q23, emitter-follower transistors Q20,Q21, Q26 and Q27, constant current transistors Q19,Q24 adapted to receive a constant voltage E4 from a bias circuit (not shown), resistances R22 to R32, coil L1 and a capacitor C6.

The coil L1 and the capacitor C6 are adapted to resonant with the intermediate frequency carrier wave signal. Consequently, the intermediate frequency carrier wave signal is reproduced by the emitter-follower transistors Q26,Q27, and is delivered from the latter to lines $l_{15}, l_{16}$.

The transistor Q25 is used for the same purpose as the transistor Q10 in the circuit of FIG. 4.

The detection circuit 32 is a balance detection circuit consisting of transistors Q28 to Q34 and resistances R33 to R36. The bases of the transistors Q28 and Q29 receive the IF signal delivered from the emitter-follower transistors Q15 and Q16, while the transistors Q31 to Q34 receive as illustrated the carrier wave signal delivered from the emitter-follower transistors Q26 and Q27, so as to deliver a balanced video signal to the resistances R35 and R36.

The amplifier circuit 33 consists of emitter-follower transistors Q35,Q36, differential transistors Q37,Q38, constant current transistor Q41 adapted to receive a constant voltage delivered from a bias circuit (not shown), transistors Q39,Q40 of current-mirror operation type, and resistances R37 to R43, and is adapted to deliver an amplified video signal to the common collector of the above mentioned transistors Q38 and Q40.

One of the input terminals of the IF amplifier 2 is connected through the capacitor C2 to the input voltage source Vin, i.e. to the tuner, while the other input terminal is grounded through the capacitor C3.

The outputs from the first and the second AGC circuits 4 and 9 are applied to the output point of a time-constant circuit 10 constituted by the capacitor C1 and the resistance R8. This time-constant circuit 10 is intended for setting the time constant of the above mentioned AGC circuits, and is usually mounted externally of the IC. The output from this time-constant circuit 10 is applied to the gain control terminal of the IF amplifier 2.

A negative feedback circuit 11 is constituted by resistances R4 to R7 and capacitors C4,C5.

The circuit arrangement of the second AGC circuit 9 is as follows.

Means are constituted by two npn transistors Q1,Q2, for detecting the excessive output from the IF amplifier 2, while means for allowing an electric current to run, upon receipt of the detecting output, is constituted by a current-mirror circuit 12. The emitter of the transistor Q1 is connected to the base of the transistor Q2 and to one of the output terminals of the IF amplifier, while the emitter of the transistor Q2 is connected to the base of the transistor Q1 and to the other output terminal of the IF amplifier. The bases of the transistors Q1 and Q2 are usually held at the same potential, due to the presence of the feedback loop of the DC feedback circuit 11.

The current-mirror circuit 12 includes a resistance R1 and a diode D1 which are connected between the common collector of the transistors Q1,Q2 and the power supply Vcc, a pnp transistor Q3 connected at its input to the output of the collector of the transistors Q1,Q2 a bias resistance R2 and a bleeder resistance R3 of the transistor Q3 and an npn transistor Q4 adapted to receive the output from the collector of the above mentioned transistor Q3. Thus, in the normal condition of operation, no current is allowed to pass through the collectors of the transistors Q3,Q4, because these transistors are kept in OFF state. However, as the transistors Q1 and Q2 are turned ON, the transistors Q3 and Q4 are turned ON accordingly, so as to allow a current to pass through the transistor Q4.

The operation of the described circuit arrangement is as follows.

By setting the dynamic range of the voltage Vout at the output point of the IF amplifier 2 at such a level as not to exceed the voltage between the bases and emitters of the transistors Q1,Q2, e.g. at 150 mVpp, the transistor Q1 and Q2 are never turned to effect, in the normal condition of operation. However, when the output from the IF amplifier has happened to come excessively large, due to a switching of the channels or the like reason, the voltage differential Vout at the output point becomes as large as about 1.5 V, due to the transfer of the dynamic range. Consequently, the transistors Q1,Q2 and, accordingly, the current mirror circuit 12 are brought into operation. The resulting current runs through the resistance R8 of the time-constant circuit 10, so as to make the potential at the point A higher.

Therefore, an AGC voltage is forcibly applied to the AGC terminal of the IF amplifier 2, so as to lower the gain of the latter. Consequently, the ordinary outputting condition of the IF amplifier 2 is recovered. Once the safe condition is recovered, the second AGC circuit is dismissed and the gain control is performed in the usual manner by the first AGC circuit.

As has been described, according to the practical embodiment of the invention, the undesirable lock out of the circuit does never take place, even when the switching of the channels or turning on and off of the power supply is effected during receiving of the wave of a large electric field strength.

The described embodiment is not exclusive, and various changes and modifications may be imparted thereto.

For instance, any other circuit arrangement then described, capable of detecting the excessive output condition of the IF amplifier can be used as the second AGC circuit 9. Moreover, the current mirror circuit as incorporated in the described can be neglected if the detecting means itself can produce a voltage or current in response to the excessive output from the IF amplifier 2.

The IF amplifier 2 has been described with reference to FIG. 3 as having such a characteristic that the gain is lowered as the potential at the point A is high. However, an IF amplifier the gain of which is increased as the potential at the point A gets higher, in combination with a second AGC circuit 9 having such a characteristic as to lower the potential at the point A.

The invention is suitably carried out not only in a video circuit including so-called artificial synchronous detection circuit having no oscillator, but also in such a video circuit of so-called PLL system having an oscillator as would pose a similar problem.

What is claimed is:

1. A video signal processing circuit comprising:
    an intermediate frequency amplifier circuit, for amplifying an input intermediate frequency signal, incorporating a signal amplifying transistor;
    a synchronous detection circuit for reproducing a video carrier signal in accordance with the signal output from said intermediate frequency amplifier circuit, and for producing a detection signal by making use of the reproduced carrier signal;
    a first automatic gain control circuit for delivering a first gain control signal to said intermediate frequency amplifier, in accordance with the level of the detection signal upon receipt of the detection signal from said synchronous detection circuit; and
    a second automatic gain control circuit for delivering a second gain control signal to said intermediate frequency amplifier, in accordance with the level of the output from said intermediate frequency amplifier circuit, wherein said second gain control signal lowers the gain of said intermediate frequency amplifier circuit only when the level of the output from said intermediate frequency amplifier circuit becomes excessively high so as to force said signal amplifying transistor to function at its saturation region.

2. A video signal processing circuit comprising:
    an intermediate frequency amplifier circuit, for amplifying an input intermediate frequency signal, incorporating a signal amplifying transistor;
    a synchronous detection circuit for reproducing a video carrier signal in accordance with the signal output from said intermediate frequency amplifier circuit, and for producing a detection signal by making use of the reproduced video carrier signal;
    a first automatic gain control circuit for delivering a first gain control signal to said intermediate frequency amplifier, in accordance with the level of the detection signal upon receipt of the detection signal from said synchronous detection circuit; and
    a second automatic gain control circuit for delivering a second gain control signal to said intermediate frequency amplifier, including means for determining when the level of the output from said intermediate frequency amplifier circuit, exceeds a predetermined level, and means for lowering the gain of said intermediate frequency amplifier circuit with said second gain control signals only when the determining means indicates that the level of the output from said intermediate frequency amplifier circuit has exceeded said predetermined level.

3. A video processing circuit as set forth in claim 2, wherein said predetermined level corresponds to an output signal level of said intermediate frequency amplifier circuit at which said signal amplifying transistor operates in its saturation region.

4. A video signal processing circuit as set forth in claim 1 or 2, wherein said first and second gain control signals are combined at a terminal and then delivered to a gain control input terminal of said intermediate frequency amplifier circuit.

5. A video signal processing circuit as set forth in claim 1 or 3, wherein said intermediate frequency amplifier circuit produces a pair of difference signals.

6. A video signal processing circuit as set forth in claim 5, wherein said second automatic gain control circuit includes a transistor having a base coupled to one of said difference signals and an emitter coupled to the other of said difference signals.

7. A video signal processing circuit as set forth in claim 6, wherein said intermediate frequency amplifier circuit consists of more than two stages of amplifier units arranged in a cascade connection.

8. A video signal processing circuit as set forth in claim 6, wherein said transistor of said second automatic gain control circuit is rendered conductive when the voltage difference between the difference signals exceeds a predetermined value.

9. A video signal processing circuit as set forth in claim 8, wherein said predetermined value of said voltage difference corresponds to the output signal level of said intermediate frequency amplifier circuit at which said signal amplifying transistor operates in its saturation region.

* * * * *

UNITED STATES PATENT AND TRADEMARK OFFICE
CERTIFICATE OF CORRECTION

PATENT NO. : 4,209,805
DATED : June 24, 1980
INVENTOR(S) : T. Ikeda et al

It is certified that error appears in the above-identified patent and that said Letters Patent are hereby corrected as shown below:

The front page of the patent should indicate the following:

"Assignee: Hitachi, Ltd., Japan"

Signed and Sealed this

Third Day of March 1981

[SEAL]

Attest:

RENE D. TEGTMEYER

Attesting Officer

Acting Commissioner of Patents and Trademarks